United States Patent Office 3,563,741

Patented Feb. 16, 1971

3,563,741

PHOTOPOLYMERISATION OF ETHYLENICALLY UNSATURATED ORGANIC COMPOUNDS

Gerard Albert Delzenne, Gravenwezel, and Urbain Leopold Laridon, Wilrijk, Belgium, assignors to Gevaert-Agfa N.V., Mortsel, Belgium, a Belgian company No Drawing. Filed Aug. 5, 1968, Ser. No. 749,950
Claims priority, application Great Britain, Sept. 8, 1967, 41,218/67
Int. Cl. G03c *1/68*
U.S. Cl. 96—35.1 8 Claims

ABSTRACT OF THE DISCLOSURE

Photopolymerization of ethylenically unsaturated organic compounds using epoxy ketone initiators.

The present invention relates to the photopolymerisation of ethylenically unsaturated organic compounds and to polymers obtained therefrom.

The photopolymerisation of ethylenically unsaturated organic compounds can be initiated by exposure to high intensity radiation such as ultra-violet rays. Methyl acrylate, for instance, on long standing in sun light is transformed into a transparent mass (cf. Ellis: The Chemistry of Synthetic Resins, vol. II (1935) page 1072). Polymerisation, however, by the use of light alone, proceeds at a very much slower rate when compared to polymerisation brought about by a free radical generating catalyst or by heat. Moreover, the use of light alone, unaided by other agents, requires very long exposure times in order to polymerise the monomer sufficiently. Furthermore, the low rate of polymerisation necessitates the use of extremely intense radiations such as those obtained from high intensity carbon arcs.

A lot of photopolymerisation initiators, which under the influence of actinic light increase the photopolymerisation rate, have already been described. A survey of such photopolymerisation initiators has been given by G. Delzenne in Industrie Chimique Belge, 24 (1959) 739–764.

According to the present invention a process is provided for the photopolymerisation of ethylenically unsaturated organic compounds, which process comprises irradiating with light of wavelengths ranging from 2500 to 5000 angstroms a composition comprising a photopolymerisable ethylenically unsaturated organic compound and as a photopolymerisation initiator a compound corresponding to one of the following general formulae:

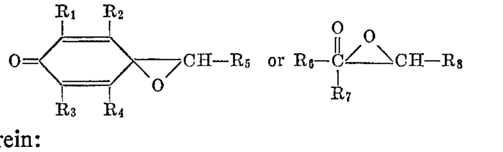

wherein:

$R_1$ and $R_2$ each represents a hydrogen atom, a halogen atom, a lower alkyl group of 1 to 2 carbon atoms, or together represent the necessary atoms to form a fused benzene ring, $R_3$ and $R_4$ each represents a hydrogen atom, a halogen atom, a lower alkyl group of 1 to 2 carbon atoms, or together represent the necessary atoms to form a fused benzene ring, $R_5$ represents a hydrogen atom or a phenyl group, $R_6$ and $R_7$ together represent the atoms necessary to form with the carbonyl group and the carbon atom a 1-indane-one group, a 1-acenaphthene-one group, a 1-tetrahydronaphthene-one group, or a 10-phenanthrene-one group, and $R_8$ represents a hydrogen atom or a phenyl group.

For facility's sake the compounds corresponding to one of the above formulae will be named "epoxy ketones" hereinafter. Suitable epoxy ketones, which can be applied as photopolymerisation initiators according to the invention are:

Compound 1: 4,5,7,8-tetrachloro-1-oxaspiro[2,5]octa-4,7-dien-6-one

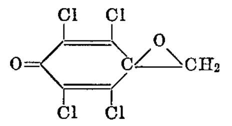

Compound 2: spiro[phenanthrene-9,2'(10H)-oxirane]-10-one

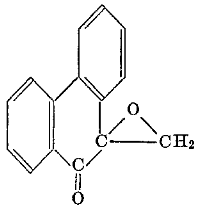

Compound 3: 3'-phenyl-spiro-[indane-2,2'-oxirane]-1-one

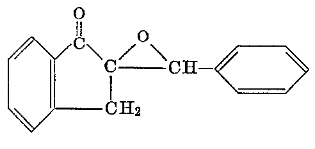

Compound 4: 3'-phenyl-4,4-dimethyl-1,2,3,4-tetrahydro-spiro-[naphthalene-2,2'-oxirane]-1-one

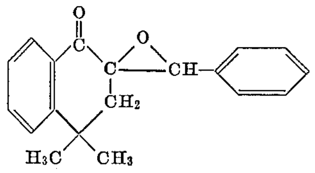

Compound 5: 3'-phenyl-spiro-[acenaphthene-2,2'-oxirane]-1-one

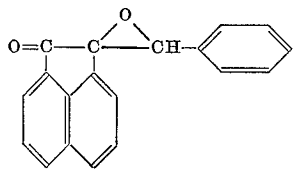

Compound 6: 3'-phenyl-spiro-[anthracene-9(10H)-2'-oxirane]-10-one

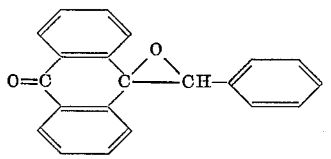

Epoxy ketones are obtained either by alkaline oxidation with hydrogen peroxide of the parent benzylidene-substituted diketones or by reaction of diazomethane with the parent diketones.

It was interesting to find that epoxy ketones possessing free rotation possibility and mobility of both groups which is not the case with the epoxy ketones of the invention, do not exhibit the same photoinitiation. This was especially true for epoxy ketones of the following formulae:

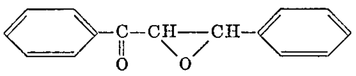

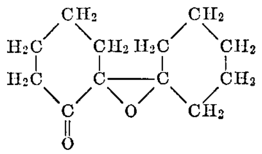

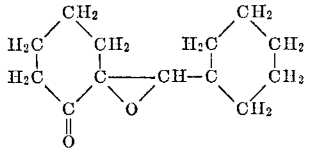

On exposure to light the epoxy ketones of the present invention probably undergo a rearrangement to a diketone structure with possibility of intermediate formation of free radicals, as was suggested by O. Jeger in Halvetica Chimica Acta (1966) No. 7, p. 2235.

The quantity of epoxy ketone to be used as photopolymerisation initiator will of course depend upon many variables including the patricular epoxy ketone used, the wavelength of light employed, the irradiation time, and the monomer or monomers present. Usually the amount of epoxy ketone is within the range of 0.01 to 5% by weight based on the monomeric material initially present. It is seldom necessary to employ more than 0.2 to 2% by weight to obtain a good polymerisation rate.

The ethylenically unsaturated organic compounds may be exposed to any radiation source providing wavelengths in the range of 2500–5000 angstroms, preferably in the wavelength region of 3000–4000 angstroms. With certain epoxy ketones having a higher absorption maximum even radiations of wavelengths above 5000 angstroms may be used. Suitable light sources include carbon arcs, mercury vapour lamps, fluorescent lamps, argon glow lamps, photographic flood lamps, anl tungsten lamps. Moreover, ordinary daylight may also be used.

The photopolymerisation can be carried out by any of the well-known processes, such as bulk, emulsion, suspension, and solution polymerisation processes. In all of these processes, the addition of an epoxy ketone according to the invention to polymerisable materials subjected to the action of actinic light greatly increases the rate of photopolymerisation.

A base or support may be coated with a solution of the ethylenically unsaturated organic compound in a solvent therefor, this solution containing in dissolved state or homogeneously dispersed therein a photopolymerisation-initiating epoxy ketone, whereupon the solvent or solvent mixture is eliminated by known means such as evaporation, leaving a more or less thin coating of the ethylenically unsaturated organic compound on the base or support. Thereafter the dried photopolymerisable coating is exposed to actinic light rays.

When exposing the photopolymerisable composition to actinic light rays the polymerisation does not start immediately. Only after a short period, which among others depends on the ethylenically unsaturated organic composition, the photopolymerisation initiator and the light intensity used, the photopolymerisation starts. The period necessary for attaining a perceptible polymerisation, is a measure of the efficiency of the photopolymerisation initiator, and is named the inhibition period.

In some circumstances it may be desirable for the photopolymerisable composition to comprise a hydrophilic or hydrophobic colloid as carrier or binding agent for the ethylenically unsaturated organic compound and the photopolymerisation initiating epoxy ketone. By the presence of this binding agent the properties of the light-sensitive layer are of course highly influenced. The choice of the binding agent is dependent on its solubility in solvents, which can also be used as solvents for the ethylenically unsaturated organic compounds and for the epoxy ketones of the invention. Such binding agents are for instance polystyrene, polymethyl methacrylate, polyvinyl acetate, polyvinyl butyral, partially saponified cellulose acetate and other polymers that are soluble in solvents for initiators and monomers. In some instances water-soluble polymers such as gelatin, casein, starch carboxymethylcellulose, and polyvinyl alcohol can be used. The ratio of photopolymerisable composition to binding agent obviously also influences the photopolymerisation. The larger this ratio, the higher the photopolymerisation rate generally will be for one and the same ethylenically unsaturated organic compound.

If the photopolymerisable composition is water-soluble water may be used as solvent for coating the support. On the contrary, if water-insoluble photopolymerisable compositions are use, organic solvents, mixtures of organic solvents or mixtures of organic solvents and water may be used.

The process of the invention is applied to the photopolymerisation of compositions comprising ethylenically unsaturated organic compounds. These compositions may comprise one or more ethylenically unsaturated polymerisable compounds such as styrene, acrylamide, methacrylamide, methyl methacrylate and acrylonitrile. When two of these monomers are used in the same photopolymerisable composition or if they are mixed with other polymerisable compounds, copolymers are formed during the photopolymerisation. It is further presumed that in the case where the photopolymerisable material is used together with a polymeric binding agent, graft copolymers are formed between the polymeric binder and the photopolymerised material.

The photopolymerisable composition may also comprise or consist of unsaturated compounds having more than one carbon-to-carbon double bond, e.g. two terminal vinyl groups, or of a polymeric compound having ethylenic unsaturation. During polymerisation of these compositions usually cross-linking will occur by means of the plurally unsaturated compound. Examples of compounds containing more than one carbon-to-carbon double bond are, e.g., divinylbenzene, diglycol diacrylates and N,N'-alkylene-bis-acrylamides. Examples of polymeric compounds containing ethylenic unsaturation are, e.g., allyl esters of polyacrylic acid, maleic esters of polyvinyl alcohol, polyhydrocarbons still containing carbon-to-carbon double bonds, unsaturated polyesters, cellulose acetomaleates, and allylcellulose.

In the photopolymerisation of ethylenically unsaturated compounds with epoxy ketones according to the invention high temperatures are not required. The exposure, however, to strong light sources at a relatively short distance, brings about a certain heating of the mass to be polymerised, which heating exercises a favourable influence upon the polymerisation rate.

The photopolymerisable compositions which contain epoxy ketones are useful in the preparation of photographic images.

The products of the invention are useful as adhesives, coating and impregnating agents, safety glass interlayers, etc. When photopolymerisation of the compositions is carried out within a mold, optical articles such as lenses can be obtained.

The present invention also comprises spreading the polymerisable composition upon a surface such as a surface of metal and printing a design thereon photographically by exposure to light through a suitable image pattern. Hereby the light induces polymerisation in the exposed areas of the photopolymerisation composition whereby the polymeric layer is rendered insoluble in the solvent or solvents used for applying the photopolymerisable layer. Thereafter the non-exposed areas are washed away with a solvent for the monomeric material. In this way printing plates and photographic resist images are manufactured, which can be further used as planographic printing plates, as matrices for printing matter, as screens for slik screen printing, and as photoresists for etching.

The image-wise photopolymerisation can also induce differential softening properties to the layer. This makes possible a reproduction process by material transfer when the image-wise photopolymerised layer is subsequently warmed up and pressed against a receiving sheet, so that the softened areas are transferred to the receiving sheet.

The following examples illustrate the present invention.

EXAMPLE 1

An amount of 6 g. of acrylamide was dissolved in a mixture of 10 ml. of water and 10 ml. of methylglycol. A certain amount of photopolymerising epoxy ketone according to the invention was added thereto. The solution was poured in a borosilicate glass test-tube and without oxygen expulsion exposed to a 300 watt high pressure mercury vapour lamp placed at a distance of 18 cm. The resulting polymer was separated by the addition of surplus methanol, dried, and weighed. The results are listed in the following table:

| | Concentration of initiator, mole/litre | Exposure in minutes | Polymer yield weight, percent |
|---|---|---|---|
| Initiator: | | | |
| 1 | $10^{-3}$ | 15 | 4.14 |
| | | 30 | 15.35 |
| | | 45 | 26.5 |
| | | 60 | 47.3 |
| | | 75 | 66.5 |
| 2 | $10^{-2}$ | 30 | 9.2 |
| | | 45 | 66 |
| | | 60 | Gelification |
| 4 | $10^{-3}$ | 5 | 7 |
| | | 10 | 43 |
| | | 15 | Gelification |
| 6 | $10^{-3}$ | 5 | 20.3 |
| | | 10 | 50.5 |
| | | 15 | 65 |
| | | 20 | Gelification |

Gelification corresponds to a yield of approximately 90–95%. The numbers of the initiators refer to the numbers of epoxy ketones cited in the description.

EXAMPLE 2

An amount of 4 g. of acrylic acid was dissolved in a mixture of 10 ml. of water and 10 ml. of methylglycol in the presence of $2\times10^{-3}$ mole/litre of the photopolymerisation initiator 6. The solution was exposed for 45 minutes as described in Example 1. The separation and drying steps were analogous to those of Example 1. Yield of polymer: 55.1% by weight.

EXAMPLE 3

The process of Example 2 was repeated, with the proviso, that 4 g. of acrylic acid were replaced by 5 ml. of triethylene glycol diacrylate. The solution was exposed for one hour as described in Example 1. Yield of polymer: 48.5% by weight.

EXAMPLE 4

A quantity of 10 ml. of ethyl acrylate was dissolved in 10 ml. of methylglycol. After expulsion of the dissolved oxygen by means of a nitrogen current and addition of $2\times10^{-3}$ mole/litre of the initiator 6, the solution was exposed as described in Example 1.

Yields of polymer:
- after 60 minutes of exposure: 31.8% weight
- after 120 minutes of exposure: 70.5% by weight
- after 180 minutes of exposure: gelification.

EXAMPLE 5

An amount of 3 g. of acrylamide was dissolved in a mixture of 5 ml. of water and 5 ml. of methylglycol. To 10 ml. of the resulting solution $10^{-5}$ mole of the initiator 5 were added. So the concentration of initiator was $10^{-3}$ mole/litre. The solution was exposed in a borosilicate glass test-tube to a high pressure mercury vapour lamp of 80 watt, placed at a distance of 20 cm. After an exposure of 15 minutes gelification occurs. Yield: 90–95%.

EXAMPLE 6

The process of Example 5 was repeated, but with the initiator 3. Gelification also occurred after 15 minutes of exposure.

EXAMPLE 7

An amount of 10 g. of the copolymer of ethylene and maleic anhydride was dried for 24 hours at 110° C. and then dissolved together with 5 ml. of triethylene glycol diacrylate, 0.10 g. of the initiator 4, and 0.025 g. of di-tert.butyl-p-cresol in 50 ml. of acetone. The mixture was coated on glass plates and dried so that the resulting layer was 0.5 mm. thick. The layer was then exposed for 30 minutes through a negative to a high pressure mercury vapour lamp of 80 watt, placed at a distance of 10 cm. A relief image of the original was obtained by development in acetone, which is a solvent for the non-exposed areas.

We claim:

1. Process for the photopolymerisation of ethylenically unsaturated organic compounds, which comprises irradiating with light of wavelengths ranging from 2500 to 5000 angstroms a composition comprising a photopolymerisable ethylenically unsaturated organic compound and as a photopolymerization initiator a compound corresponding to one of the formulae:

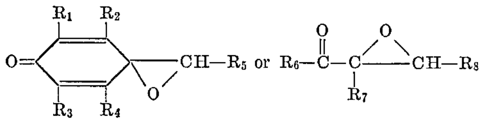

wherein $R_1$ and $R_2$ each represents hydrogen, a halogen atom, an alkyl group of 1 to 2 carbon atoms, or together represent the necessary atoms to form a fused benzene ring, $R_3$ and $R_4$ each represents hydrogen, a halogen atom, an alkyl group of 1 to 2 carbon atoms, or together represent the necessary atoms to form a fused benzene ring, $R_5$ represents hydrogen or a phenyl group, $R_6$ and $R_7$ together represent the atoms necessary to form with the carbonyl group and the carbon atom a 1-indane-one group, a 1-acenaphthene-one group, a 1-tetrahydronaphthene-one group, or a 10-phenanthrene-one group, and $R_8$ represents hydrogen or a phenyl group.

2. Process according to claim 1, wherein the photopolymerisation initiator is present in an amount between 0.01 to 5% by weight based on the ethylenically unsaturated organic compound present.

3. Process according to claim 1, wherein the photopolymerisation initiator is 3′-phenyl-spiro[indane-2,2′-oxirane]-1-one.

4. Process according to claim 1, wherein the photopolymerisation initiator is 3′-phenyl-4,4-dimethyl-1,2,3,4-tetrahydro-spiro-[naphthalene-2,2′-oxirane]-1-one.

5. Process according to claim 1, wherein the photopolymerisation initiator is 3′-phenyl-spiro-[acenaphthene-2,2′-oxirane]-1-one.

6. Process according to claim 1, wherein the photopolymerisation initiator is 3′-phenyl-spiro-[anthracene-9(10H),2′-oxirane]-10-one.

7. Process for producing photographic printing plates which comprises exposing to a pattern of light radiation of 2500 to 5000 angstroms, a photographic element comprising a support and a light-sensitive layer of a composition comprising a photopolymerisable ethylenically unsaturated organic compound and as a photopolymerisation initiator a compound corresponding to one of the general formulae:

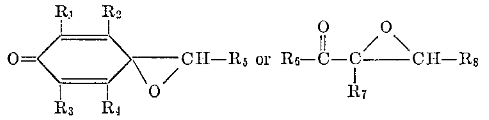

wherein $R_1$ and $R_2$ each represents hydrogen, a halogen atom, an alkyl group of 1 to 2 carbon atoms, or together represent the necessary atoms to form a fused benzene ring,
$R_3$ and $R_4$ each represents hydrogen, a halogen atom, an alkyl group of 1 to 2 carbon atoms, or together represent the necessary atoms to form a fused benzene ring,
$R_5$ represents hydrogen or a phenyl group,
$R_6$ and $R_7$ together represent the atoms necessary to form with the carbonyl group and the carbon atom a 1-indane-one group, a 1-acenaphthene-one group, a 1-tetrahydronaphthene-one group, or a 10-phenanthrene-one group, and
$R_8$ represents hydrogen or a phenyl group, whereby in said layer said polymerisable ethylenically unsaturated organic compound is polymerised according to said pattern of light radiation, and washing away the residual unpolymerised ethylenically unsaturated organic compound to leave a polymerised photographic relief image of said pattern of light radiation.

8. A photopolymerizable element comprising a support and superposed thereon a light-sensitive layer comprising at least one photopolymerizable ethylenically unsaturated organic compound and as a photopolymerization initiator a compound corresponding to one of the formulae:

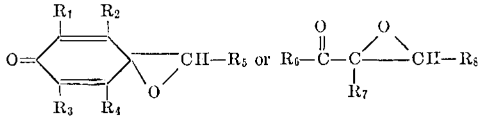

wherein $R_1$ and $R_2$ each represents hydrogen, a halogen atom, an alkyl group of 1 to 2 carbon atoms, or together represent the necessary atoms to form a fused benzene ring,
$R_3$ and $R_4$ each represents hydrogen, a halogen atom, an alkyl group of 1 to 2 carbon atoms, or together represent the necessary atoms to form a fused benzene ring,
$R_5$ represents hydrogen or a phenyl group,
$R_6$ and $R_7$ together represent the atoms necessary to form with the carbonyl group and the carbon atom a 1-indane-one group, a 1-acenaphthene-one group, a 1-tetrahydronaphthene-one group, or a 10-phenanthrene-one group, and $R_8$ represents hydrogen or a phenyl group.

References Cited

UNITED STATES PATENTS

| | | | |
|---|---|---|---|
| 3,484,239 | 12/1969 | Steppan et al. | 96—35.1 |
| 3,489,562 | 1/1970 | Krauch et al. | 96—35.1 |
| 3,497,353 | 2/1970 | Steppan et al. | 96—35.1 |
| 3,499,759 | 3/1970 | Maar et al. | 96—35.1 |

FOREIGN PATENTS

| | | | |
|---|---|---|---|
| 1,488,914 | 6/1967 | France | 96—35.1 |

RONALD H. SMITH, Primary Examiner

U.S. Cl. X.R.

96—115; 204—159.23